(12) United States Patent
Lin et al.

(10) Patent No.: US 12,382,702 B2
(45) Date of Patent: Aug. 5, 2025

(54) SEMICONDUCTOR DEVICE

(71) Applicant: UNITED MICROELECTRONICS CORP., Hsin-Chu (TW)

(72) Inventors: Heng-Ching Lin, Hsinchu (TW); Yu-Teng Tseng, Hsinchu (TW); Chu-Chun Chang, Kaohsiung (TW); Kuo-Yuh Yang, Hsinchu County (TW); Chia-Huei Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/544,280

(22) Filed: Dec. 18, 2023

(65) Prior Publication Data
US 2024/0120405 A1 Apr. 11, 2024

Related U.S. Application Data

(62) Division of application No. 17/068,840, filed on Oct. 13, 2020, now Pat. No. 11,894,439.

(30) Foreign Application Priority Data

Sep. 14, 2020 (CN) .......................... 202010959203.9

(51) Int. Cl.
H10D 30/60 (2025.01)
H01L 21/265 (2006.01)
H10D 64/27 (2025.01)
H10D 64/66 (2025.01)

(52) U.S. Cl.
CPC ......... *H10D 64/671* (2025.01); *H10D 30/603* (2025.01); *H10D 64/519* (2025.01); *H01L 21/26513* (2013.01)

(58) Field of Classification Search
CPC ......... H01L 21/26513; H01L 29/78654; H01L 29/1079; H01L 29/42376; H01L 29/78; H01L 29/4983; H01L 29/4238; H01L 29/7835; H01L 29/1045; H01L 29/0847; H01L 29/42384; H10D 64/671; H10D 30/608; H10D 64/519; H10D 39/673; H10D 30/6744; H10D 62/307; H10D 62/151; H10D 30/60; H10D 30/673; H10D 62/364; H10D 64/518
See application file for complete search history.

(56) References Cited

U.S. PATENT DOCUMENTS

| | | | | |
|---|---|---|---|---|
| 5,015,595 A | | 5/1991 | Wollesen | |
| 5,479,034 A | * | 12/1995 | Hashimoto | ....... H01L 27/11807 257/213 |
| 5,623,165 A | * | 4/1997 | Yamauchi | ......... H01L 21/28035 257/E29.151 |
| 5,998,848 A | | 12/1999 | Brown | |

(Continued)

*Primary Examiner* — Galina G Yushina
(74) *Attorney, Agent, or Firm* — Winston Hsu

(57) ABSTRACT

A semiconductor device includes a gate structure on a substrate, in which the gate structure includes a main branch extending along a first direction on the substrate and a sub-branch extending along a second direction adjacent to the main branch. The semiconductor device also includes a first doped region overlapping the main branch and the sub-branch according to a top view and a second doped region overlapping the first doped region.

9 Claims, 5 Drawing Sheets

(56) References Cited

U.S. PATENT DOCUMENTS

| | | | |
|---|---|---|---|
| 6,307,237 B1* | 10/2001 | Erstad | H01L 27/1203 |
| | | | 257/353 |
| 6,387,739 B1 | 5/2002 | Smith, III | |
| 6,521,952 B1* | 2/2003 | Ker | H01L 27/0262 |
| | | | 257/350 |
| 6,642,579 B2* | 11/2003 | Fung | H01L 29/78612 |
| | | | 257/E21.415 |
| 8,299,519 B2 | 10/2012 | Chou et al. | |
| 9,741,857 B2 | 8/2017 | Tarakji | |
| 10,153,342 B1 | 12/2018 | He | |
| 10,192,884 B2 | 1/2019 | Willard | |
| 10,424,664 B2* | 9/2019 | Ellis-Monaghan | |
| | | | H01L 29/4238 |
| 2008/0185635 A1 | 8/2008 | Yanagi | |
| 2010/0081239 A1* | 4/2010 | Min | H01L 21/26506 |
| | | | 438/151 |
| 2014/0084388 A1* | 3/2014 | Goto | H01L 29/66477 |
| | | | 257/288 |
| 2015/0303254 A1* | 10/2015 | Tschumakow | |
| | | | H01L 21/823481 |
| | | | 438/294 |
| 2018/0166566 A1 | 6/2018 | Ellis-Monaghan | |
| 2018/0211973 A1* | 7/2018 | Willard | H01L 29/1095 |

\* cited by examiner

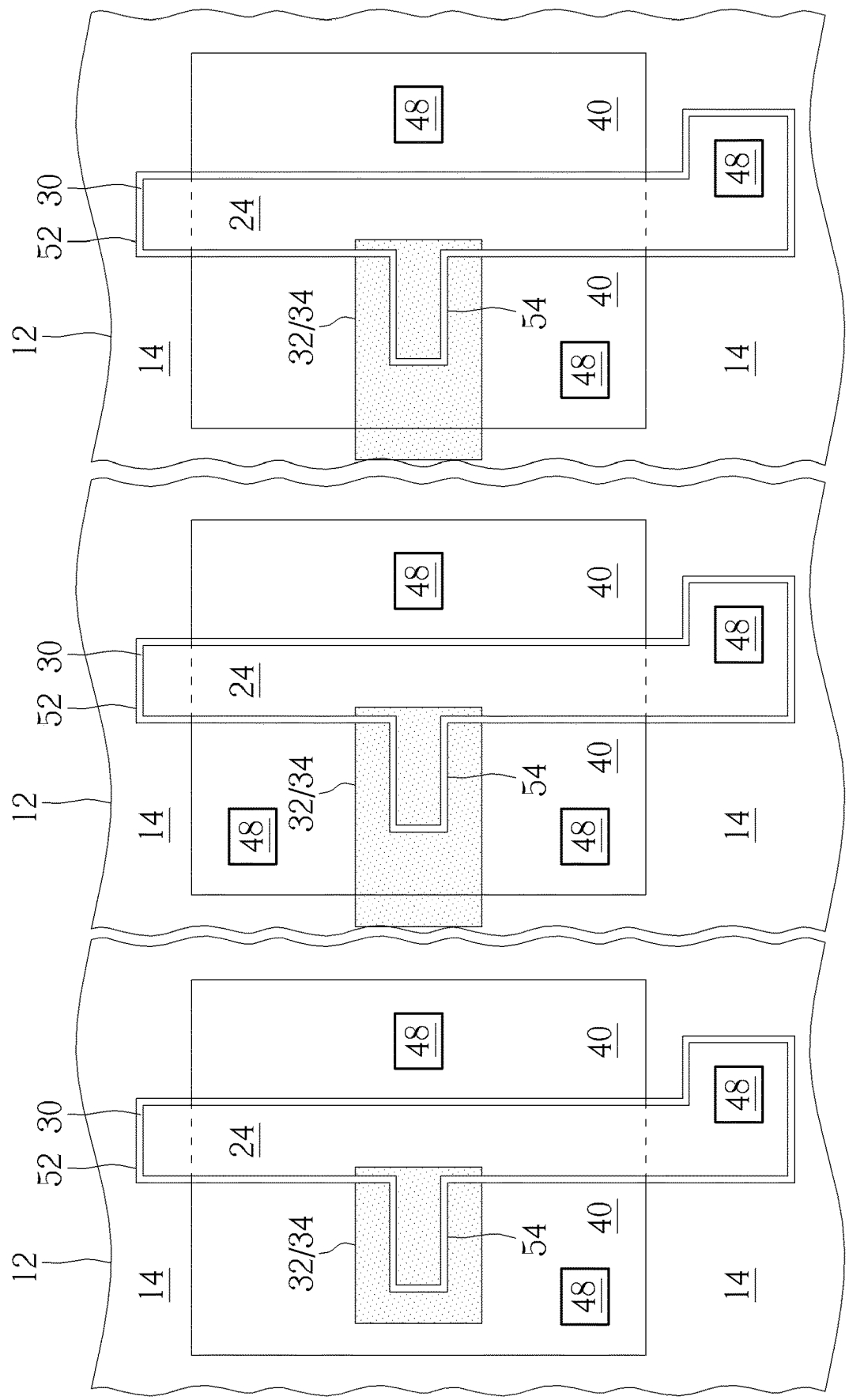

SEMICONDUCTOR DEVICE

CROSS REFERENCE TO RELATED APPLICATIONS

This application is a division of U.S. application Ser. No. 17/068,840, filed on Oct. 13, 2020. The content of the application is incorporated herein by reference.

BACKGROUND OF THE INVENTION

1. Field of the Invention

The invention relates to a semiconductor device, and more particularly to a semiconductor device with doped region overlapping main branch and sub-branch of a gate structure.

2. Description of the Prior Art

Floating body silicon-on-insulator (SOI) transistors are limited in operating voltage and power due to accumulated hot carriers which can increase the electrical potential of the body region of the SOI transistors. Body tied SOI transistors have been shown to extend voltage and power handling capabilities when compared to floating body SOI transistors.

However, layout design of body region of current body tied SOI transistors often occupies excessive area which not only results in poor performance but also induces kink effect that further causes problems such as threshold voltage shift, memory effect, or delay effect. Hence how to improve the aforementioned problems in current SOI transistors has become an important task in this field.

SUMMARY OF THE INVENTION

According to an embodiment of the present invention, a semiconductor device includes a gate structure on a substrate, in which the gate structure includes a main branch extending along a first direction on the substrate and a sub-branch extending along a second direction adjacent to the main branch. The semiconductor device also includes a first doped region overlapping the main branch and the sub-branch according to a top view and a second doped region overlapping the first doped region.

According to another aspect of the present invention, a semiconductor device includes a gate structure on a substrate, in which the gate structure includes a main branch extending along a first direction on the substrate and a sub-branch extending along a second direction adjacent to the main branch. The semiconductor device further includes a first doped region overlapping the sub-branch, in which a first side of the first doped region is aligned with a first side of the sub-branch along the second direction.

These and other objectives of the present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a structural view of a semiconductor device according to an embodiment of the present invention.

FIG. 4 illustrates a structural view of a semiconductor device according to an embodiment of the present invention.

FIG. 5 illustrates a structural view of a semiconductor device according to an embodiment of the present invention.

DETAILED DESCRIPTION

Figure 1:
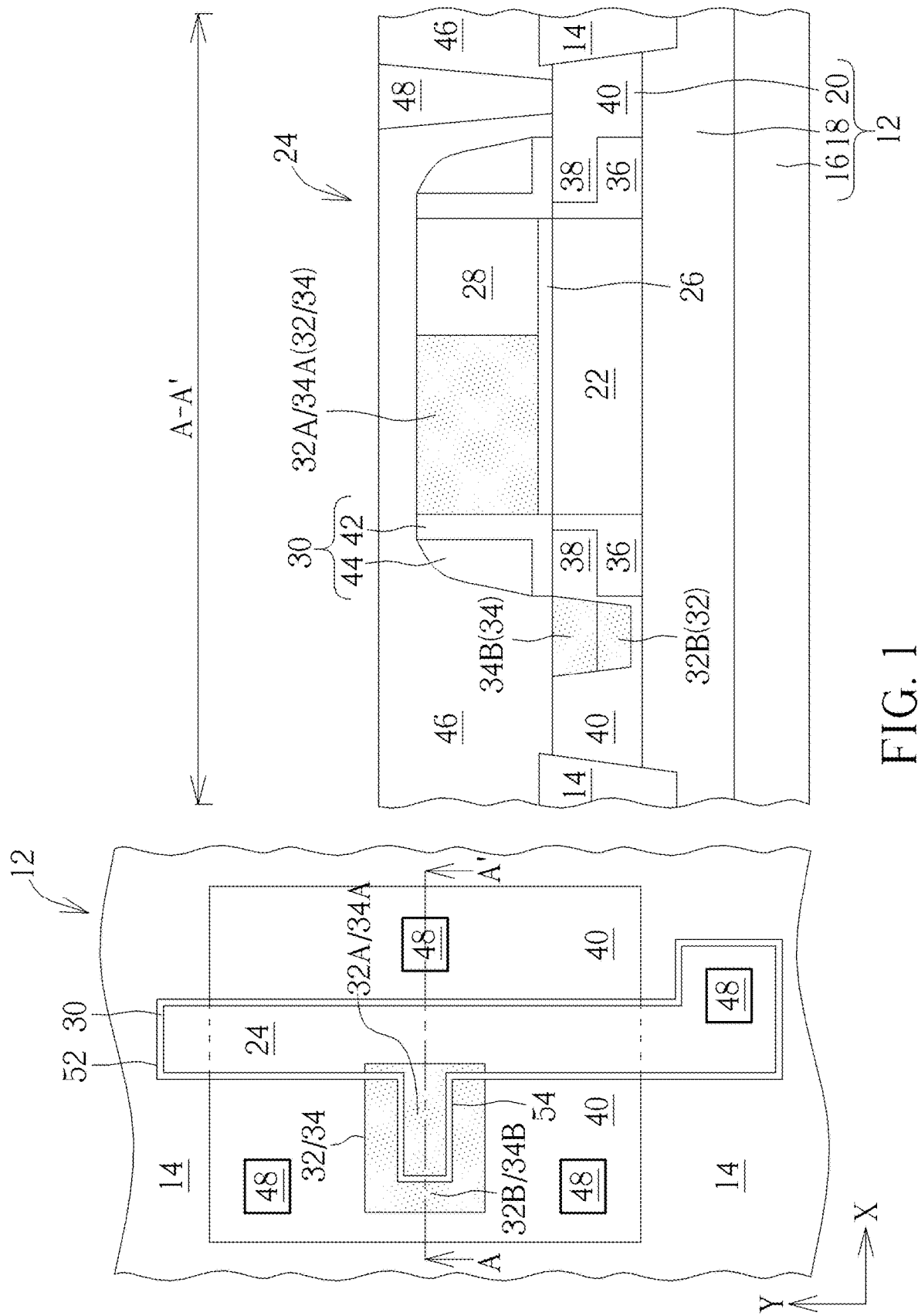
FIG. 1 illustrates a structural view of a semiconductor device according to an embodiment of the present invention.
Figure 2:
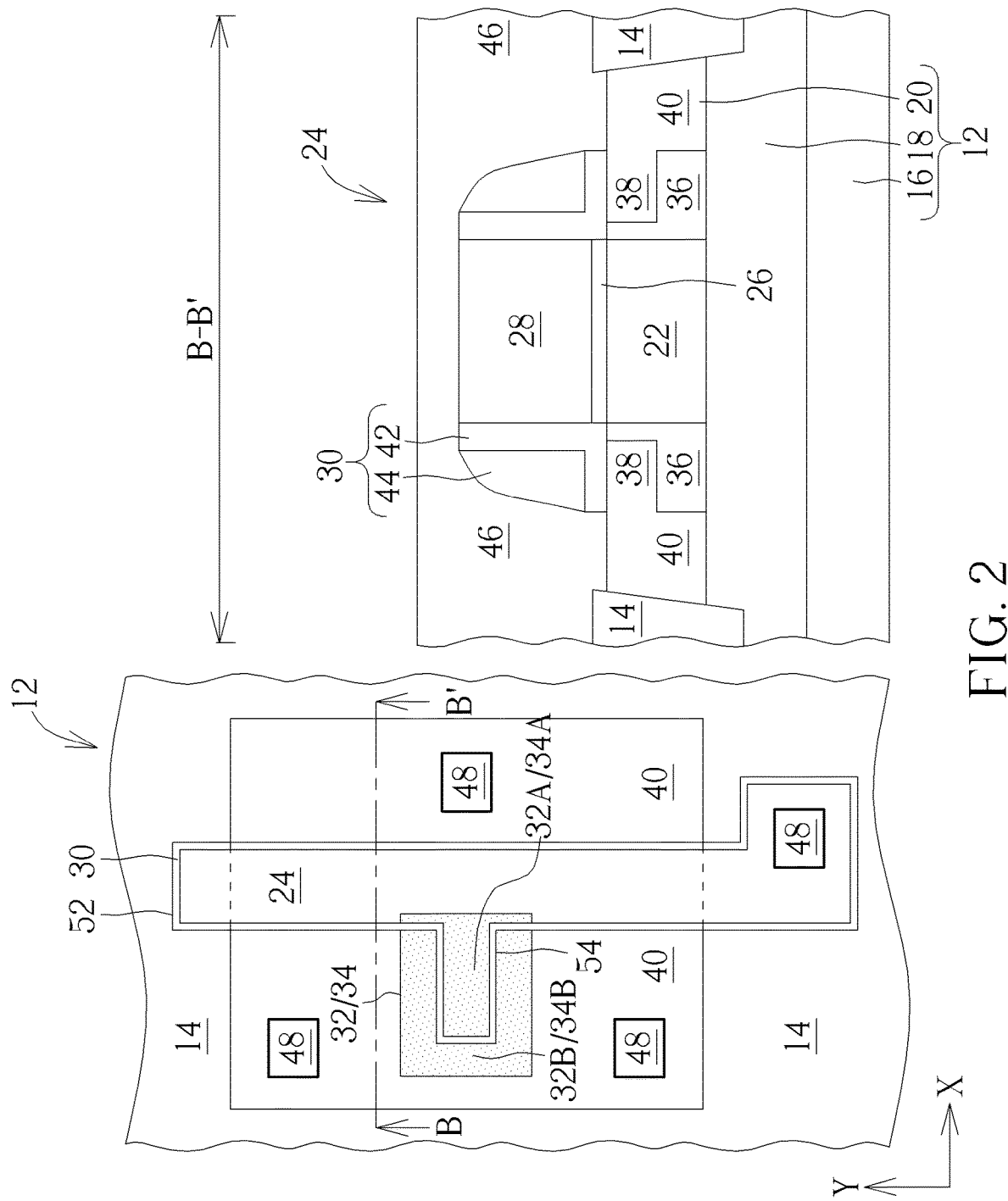
FIG. 2 illustrates a structural view of a semiconductor device according to an embodiment of the present invention.

Referring to FIGS. 1-2, FIGS. 1-2 illustrate structural views of a semiconductor device according to an embodiment of the present invention, in which the left portions of FIGS. 1-2 illustrate top views of the semiconductor device, the right portion of FIG. 1 illustrates a cross-section view of the left portion taken along the sectional line AA', and the right portion of FIG. 2 illustrates a cross-section view of left portion taken along the sectional line BB'. As shown in FIGS. 1-2, a substrate 12 such as a silicon substrate or silicon-on-insulator (SOI) substrate is provided, a transistor region such as a PMOS region or a NMOS region is defined on the substrate 12, and a shallow trench isolation (STI) 14 made of silicon oxide is formed on the substrate 12 to surround the transistor region. In this embodiment, the substrate 12 preferably includes a SOI substrate, which further includes a lower level substrate 16 made of silicon handle wafer, an insulating layer 18, and an upper level substrate 20 also made of silicon. Preferably, the insulating layer 18 includes silicon oxide and the upper level substrate 20 could further include a well region 22. Since this embodiment pertains to the fabrication of a NMOS transistor, the well region 22 preferably includes a p-well.

Next, at least a gate structure 24 is formed on the substrate 12. In this embodiment, the formation of the gate structure 24 could be accomplished by a gate first process, a high-k first approach from gate last process, or a high-k last approach from gate last process. Since this embodiment pertains to a high-k first approach, a gate dielectric layer 26 or interfacial layer, a gate material layer 28 made of polysilicon, and a selective hard mask (not shown) could be formed sequentially on the substrate 12, and a pattern transfer process is then conducted by using a patterned resist (not shown) as mask to remove part of the gate material layer 28 and part of the gate dielectric layer 26 through single or multiple etching processes. After stripping the patterned resist, a gate structure 24 composed of patterned gate dielectric layer 26 and patterned material layer 28 is formed on the substrate 12.

Next, at least a spacer 30 is formed on the sidewalls of the gate structure 24, a plurality of doped regions including pocket regions 36, lightly doped drains (LDDs) 38, source/drain regions 40, doped regions 32, and doped regions 34 (also referred to as body regions) could be formed in the substrate 12 adjacent to two sides of the gate structure 24 through implantation processes after or before the spacer 30 is formed, and a selective silicide layer (not shown) could be formed on the surface of the source/drain regions 40. In this embodiment, the spacer 30 could be a single spacer or a composite spacer, such as a spacer including but not limited to for example an offset spacer 42 and a main spacer 44. Preferably, the offset spacer 42 and the main spacer 44 could include same material or different material while both the offset spacer 42 and the main spacer 44 could be made of material including but not limited to for example $SiO_2$, SiN, SiON, SiCN, or combination thereof. The LDDs 38 and source/drain regions 40 could include n-type dopants or p-type dopants depending on the type of device being fabricated.

In this embodiment, the concentration of the doped regions 32, 34 is preferably greater than the concentration of the pocket regions 36 and/or LDDs 38. For instance, if the doped regions 32, 34 were to include n-type dopants, the energy used to implant n-type dopants is preferably between 20-40 KeV while the concentration of n-type dopants such as arsenic or phosphorus is between $1.0 \times 10^{13}$ atoms/cm$^3$ to $5.0 \times 10^{15}$ atoms/cm$^3$. If the doped regions 32, 34 were to include p-type dopants, the energy used to implant p-type dopants is preferably between 10-30 KeV while the concentration of p-type dopants such as boron is between $1.0 \times 10^{13}$ atoms/cm$^3$ to $1.0 \times 10^{15}$ atoms/cm$^3$. If the LDDs 38 and/or source/drain regions 40 were to include n-type dopants, the energy used to implant n-type dopants is preferably between 10-50 KeV while the concentration of n-type dopants such as arsenic or phosphorus is between $1.0 \times 10^{13}$ atoms/cm$^3$ to $5.0 \times 10^{15}$ atoms/cm$^3$. If the LDDs 38 and/or source/drain regions 40 were to include p-type dopants, the energy used to implant p-type dopants is preferably between 10-60 KeV while the concentration of p-type dopants such as boron is between $1.0 \times 10^{13}$ atoms/cm$^3$ to $1.0 \times 10^{15}$ atoms/cm$^3$.

Next, a contact etch stop layer (CESL) (not shown) could be formed on the surface of the substrate 12 and the gate structure 24, and an interlayer dielectric (ILD) layer 46 is formed on the CESL. Next, a photo-etching process is conducted by using a patterned mask (not shown) as mask to remove part of the ILD layer 46 and part of the CESL for forming contact holes (not shown) exposing the top surface of the gate structure 24 and the source/drain regions 40. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 48 electrically connecting the source/drain region 40 and the gate structure 24.

Referring again to the left portions of FIGS. 1-2, as shown in FIGS. 1-2, the semiconductor device when viewed under a top view perspective includes a gate structure 24 disposed on the substrate 12, in which the gate structure 24 further includes a main branch 52 extending along a first direction such as X-direction on the substrate 12 and a sub-branch 54 extending along a second direction such as Y-direction on the substrate 12 adjacent to the main branch 52. Since the main branch 52 and the sub-branch 54 are fabricated under same fabrication process the two branches 52, 54 are preferably made of same material and connected to each other directly. The semiconductor device also includes source/drain regions 40 adjacent to two sides of the gate structure 24, a STI 14 surrounding the source/drain regions 40, and contact plugs 48 disposed on the source/drain regions 40 and end of the main branch 52, in which the end of the main branch preferably includes an L-shape.

The semiconductor further includes at least a doped region such as the doped region 32 and/or doped region 34 overlapping the main branch 52 and the sub-branch 54 according to a top view, in which the doped region 32 and the doped region 34 could share same size or different sizes under a top view perspective while the doped regions 32, 34 preferably overlap the entire sub-branch 54, part of the main branch 52, and the source/drain region 40 adjacent to one side of the gate structure 24. It should be noted that the notion of doped regions 32, 34 overlapping the sub-branch 54, the main branch 52, and the source/drain region 40 in this embodiment could be defined by having the dopants of the doped regions 32, 34 being implanted not only into the substrate 12 adjacent to one side of the gate structure 24 to replace part of the source/drain region 40 but also implanted into part of the gate material layer 28 of the gate structure 24 (hence the meaning of overlapping the sub-branch and part of the main branch of the gate structure 24). Since the gate structure 24 made of polysilicon is often doped with light amount of dopants after being patterned into gate structure 24, the gate structure 24 after being implanted with new dopants during the formation of the doped regions 32, 34 would then be divided into two portions having different doping concentrations but same conductive type. For instance, as shown in FIG. 1, the left portion of the gate material layer 28 preferably includes same doping concentration as the doped regions 32, 34 while the right portion of the gate material layer 28 includes doping concentration less than that of the doped regions 32, 34. In FIG. 1, in order to clearly mark the components, the doped regions 32, 34 in the gate material layer 28 are labeled as the doped regions 32A and 34A, and the doped regions 32, 34 in the upper level substrate (or in the source/drain region 40) are labeled as the doped regions 32B and 34B. It is worth noting that the doped regions 32A and 32B both belong to the doped region 32, while the doped regions 34A and 34B both belong to the doped region 34.

In this embodiment, the doped region 32 and the doped region 34 preferably include same conductive type, the doped regions 32, 34 could include same or different concentrations, the doped regions 32, 34 and the source/drain regions 40 preferably include different conductive type, and the source/drain regions 40 and the pocket regions 36 also include different conductive types. Since this embodiment pertains to fabrication of NMOS transistor device, the doped regions 32, 34 and the pocket regions 36 preferably include p-type dopants while the LDDs 38 and the source/drain regions 40 include n-type dopants. It should also be noted that even though two doped regions 32 and 34 are formed to overlap the sub-branch 54, part of the main branch 52, and the source/drain region 40 at the same time in this embodiment, according to other embodiments of the present invention it would also be desirable to only form a single doped region such as the doped region 32 or the doped region 34 for overlapping the sub-branch 54, the main branch 52, and the source/drain region 40, which is also within the scope of the present invention.

Referring again to FIGS. 3-5, FIGS. 3-5 illustrate structural top views of a semiconductor device according to different embodiments of the present invention. As shown in FIG. 3, in contrast to forming a total of three contact plugs 48 connecting the source/drain regions 40 adjacent to two sides of the main branch 52 and sub-branch 54 as shown in FIG. 1, it would also be desirable to only form a total of two contact plugs 48 connecting the source/drain regions 40 adjacent to two sides of the main branch 52 and one side of the sub-branch 54, which is also within the scope of the present invention.

As shown in FIGS. 4-5, in contrast to the doped regions 32, 34 not exceeding the edge of the source/drain regions 40 or not overlapping the STI 14 as shown in FIG. 1, it would also be desirable to extend the doped regions 32, 34 not only overlapping the entire sub-branch 54, part of the main branch 52, and the source/drain regions 40 as shown in FIG. 1 but also overlapping part of the STI 14. Similar to implanting dopants into the substrate 12 and part of the gate structure 24 during the formation of the doped regions 32, 34 in the aforementioned embodiment, dopants in this embodiment are preferably implanted into the substrate 12 adjacent to one side of the gate structure 24, into part of the gate structure 24, and into part of the STI 14 during the formation of the doped regions 32, 34.

As shown in FIG. 5, in contrast to forming a total of three contact plugs 48 connecting the source/drain regions 40 adjacent to two sides of the main branch 52 and sub-branch 54 as shown in FIG. 4, it would also be desirable to only form a total of two contact plugs 48 connecting the source/drain regions 40 adjacent to two sides of the main branch 52 and one side of the sub-branch 54, which is also within the scope of the present invention.

Figure 6:
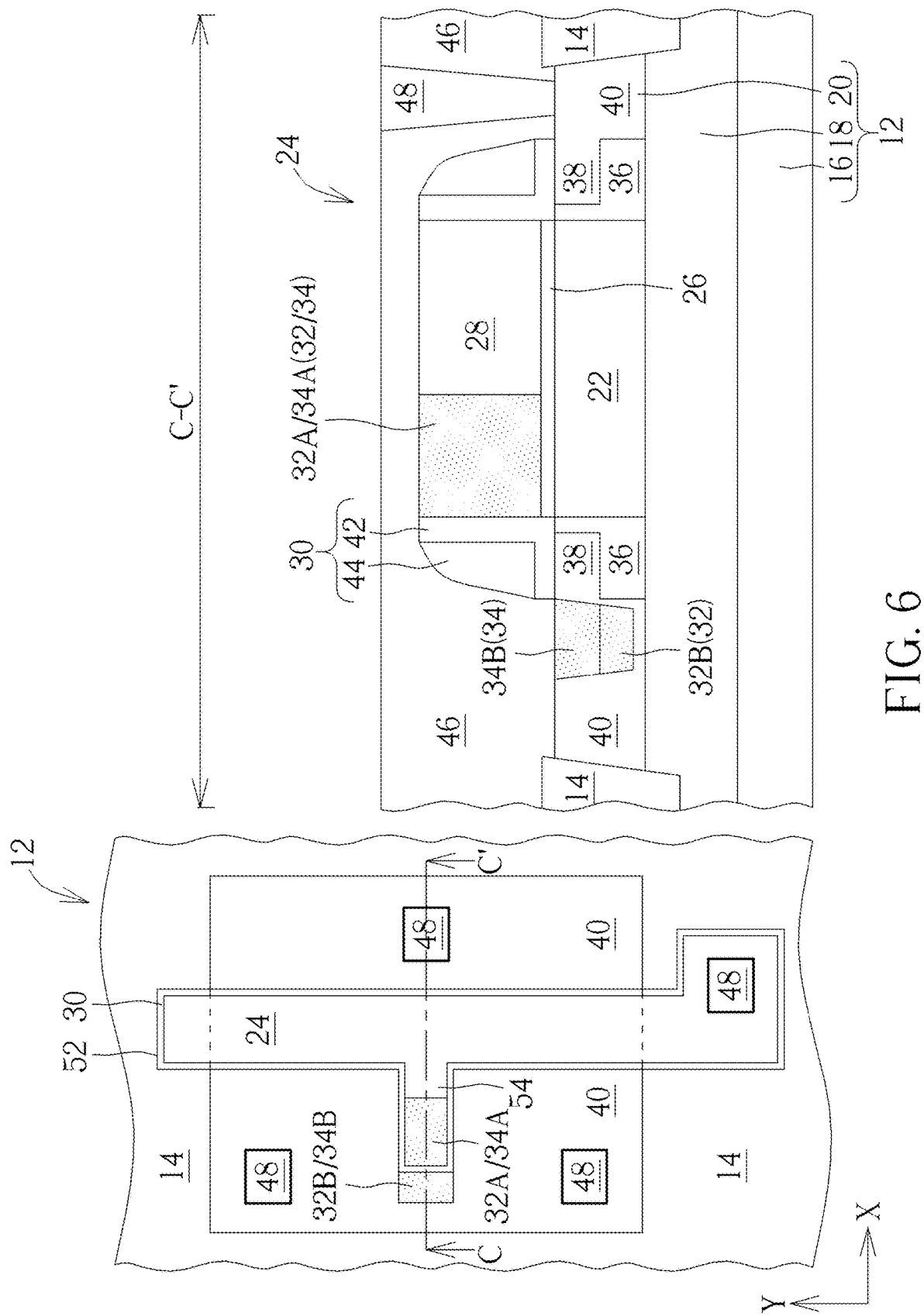
FIG. 6 illustrates a structural view of a semiconductor device according to an embodiment of the present invention.

Referring to FIG. 6, in which the left portion of FIG. 6 illustrates a top view of a semiconductor device according to an embodiment of the present invention and the right portion of FIG. 6 illustrates a cross-section view of the semiconductor device taken along the sectional line CC'. As shown in FIG. 6, in contrast to the doped regions 32, 34 overlapping the entire sub-branch 54, part of the main branch 52, and the source/drain region 40 adjacent to one side of the gate structure 24 shown in FIG. 1, the doped regions 32, 34 in this embodiment only overlap part of the sub-branch 54 and part of the source/drain region 40 but do not overlap any of the main branch 52. In FIG. 6, in order to clearly mark the components, the doped regions 32, 34 in the gate material layer 28 are labeled as the doped regions 32A and 34A, and the doped regions 32, 34 in the upper level substrate (or in the source/drain region 40) are labeled as the doped regions 32B and 34B. It is worth noting that the doped regions 32A and 32B both belong to the doped region 32, while the doped regions 34A and 34B both belong to the doped region 34. Viewing from a more detailed perspective, the two edges or two sides of the doped regions 32, 34 extending along the X-direction are preferably aligned with two sides of the sub-branch 54 also extending along the X-direction.

Viewing from a cross-section perspective, dopants in the doped regions 32, 34 in this embodiment are preferably implanted into the substrate 12 adjacent to one side of the gate structure 24 and part of the gate material layer 28 of the gate structure 24 at the same time during the formation of the doped regions 32, 34 as disclosed in the aforementioned embodiment. It should be noted that even though the two sides of the doped regions 32, 34 extending along the X-direction are aligned with two sides of the sub-branch 54 extending along the X-direction in this embodiment, according to other embodiments of the present invention it would also be desirable to only align one side of the doped regions 32, 34 extending along the X-direction with one side of the sub-branch 54 extending along the X-direction, which is also within the scope of the present invention.

Figures 7, 8, 9:
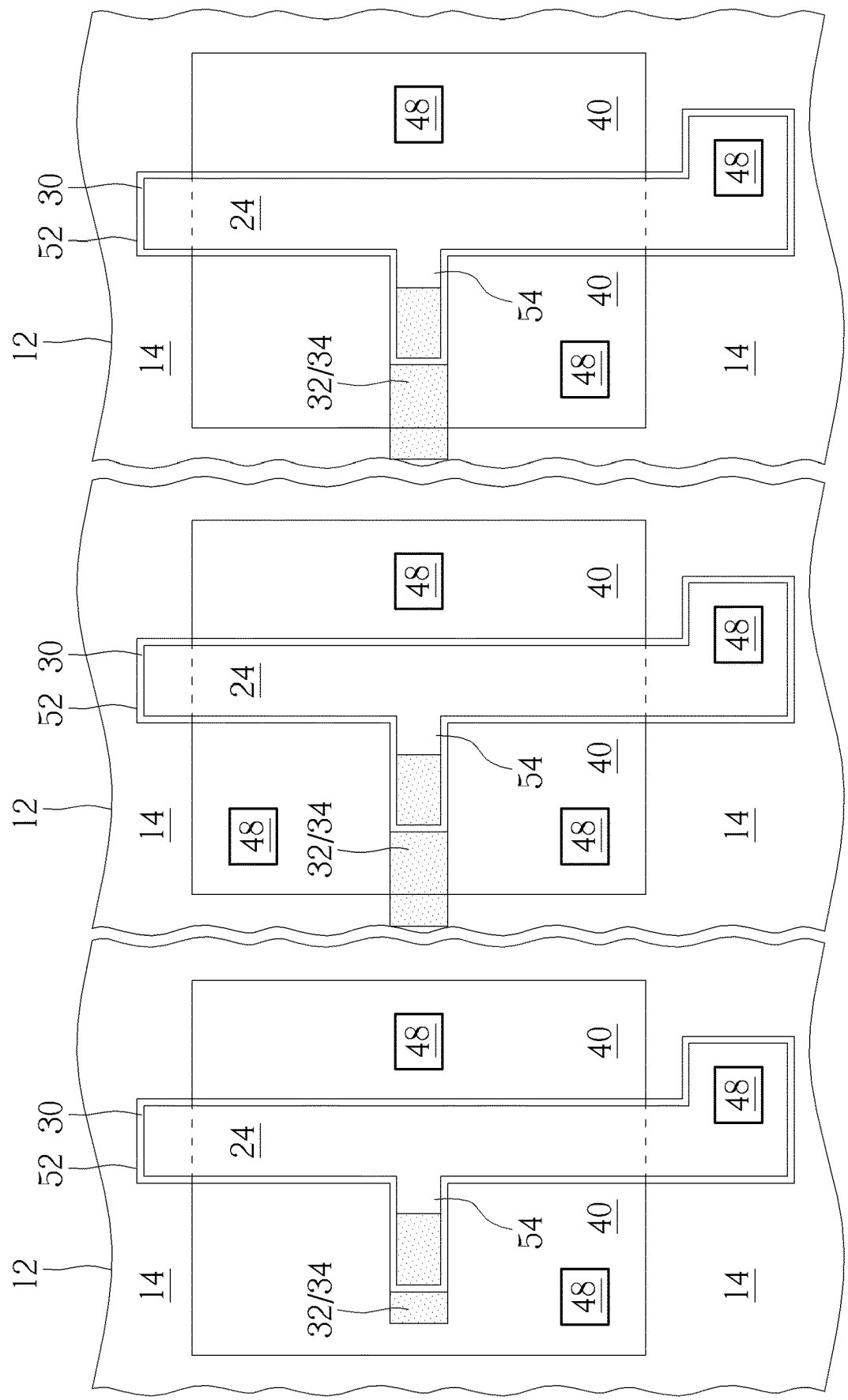
FIG. 7 illustrates a structural view of a semiconductor device according to an embodiment of the present invention.
FIG. 8 illustrates a structural view of a semiconductor device according to an embodiment of the present invention.
FIG. 9 illustrates a structural view of a semiconductor device according to an embodiment of the present invention.

Referring to FIGS. 7-9, FIGS. 7-9 illustrate structural top views of a semiconductor device according to different embodiments of the present invention. As shown in FIG. 7, in contrast to forming a total of three contact plugs 48 connecting the source/drain regions 40 adjacent to two sides of the main branch 52 and sub-branch 54 as shown in FIG. 6, it would also be desirable to only form a total of two contact plugs 48 connecting the source/drain regions 40 adjacent to two sides of the main branch 52 and one side of the sub-branch 54, which is also within the scope of the present invention.

As shown in FIGS. 8-9, in contrast to the doped regions 32, 34 not exceeding the edge of the source/drain regions 40 or not overlapping the STI 14 as shown in FIG. 6, it would also be desirable to extend the doped regions 32, 34 not only overlapping the entire sub-branch 54, part of the main branch 52, and the source/drain regions 40 as shown in FIG. 6 but also overlapping part of the STI 14. Similar to implanting dopants into the substrate 12 and part of the gate structure 24 during the formation of the doped regions 32, 34 in the aforementioned embodiment, dopants in this embodiment are preferably implanted into the substrate 12 adjacent to one side of the gate structure 24, into part of the gate structure 24, and into part of the STI 14 during the formation of the doped regions 32, 34.

As shown in FIG. 9, in contrast to forming a total of three contact plugs 48 connecting the source/drain regions 40 adjacent to two sides of the main branch 52 and sub-branch 54 as shown in FIG. 8, it would also be desirable to only form a total of two contact plugs 48 connecting the source/drain regions 40 adjacent to two sides of the main branch 52 and one side of the sub-branch 54, which is also within the scope of the present invention.

Overall, the present invention preferably alters the layout design of body doped regions and branches of the gate structure of conventional SOI transistor for improving issues such as kink effect. As disclosed in the aforementioned embodiments, it would be desirable to overlap the entire sub-branch and part of the main branch of the gate structure and the source/drain region adjacent to one side of the gate structure with body doped region or doped region 32 as shown in FIG. 1, or to form doped region 32 only overlapping part of the sub-branch and part of the source/drain region without overlapping any of the main branch of the gate structure while two sides of the doped region 32 are aligned with two sides of the sub-branch as shown in FIG. 6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate structure on a substrate, wherein the gate structure comprises:
      a main branch extending along a first direction on the substrate;
      a sub-branch extending along a second direction adjacent to the main branch, wherein the sub-branch is a part of the gate structure;
   a first doped region disposed in the sub-branch, wherein a first side of the first doped region is aligned with a first side of the sub-branch along the second direction; and
   a source/drain region adjacent to two sides of the gate structure, wherein the first doped region overlaps the source/drain region.

2. The semiconductor device of claim 1, further comprising:

a shallow trench isolation (STI) around the source/drain region.

3. The semiconductor device of claim 2, wherein the first doped region overlaps the source/drain region and the STI.

4. The semiconductor device of claim 2, wherein the source/drain region and the first doped region comprise different conductive types.

5. The semiconductor device of claim 1, further comprising a second doped region overlapping the first doped region.

6. The semiconductor device of claim 5, wherein the first doped region and the second doped region comprise same conductive type.

7. The semiconductor device of claim 1, wherein the first doped region is disposed in the gate structure.

8. The semiconductor device of claim 1, wherein the main branch comprises a L-shape.

9. The semiconductor device of claim 1, wherein a second side of the first doped region is aligned with a second side of the sub-branch along the second direction.

* * * * *